United States Patent
Joodaki

(10) Patent No.: US 7,396,739 B2
(45) Date of Patent: Jul. 8, 2008

(54) METHOD FOR INTEGRATING AN ELECTRONIC COMPONENT OR SIMILAR INTO A SUBSTRATE

(75) Inventor: Mojtaba Joodaki, Munich (DE)

(73) Assignee: ATMEL Germany GmbH, Heilbronn (DE)

( * ) Notice: Subject to any disclaimer, the term of this patent is extended or adjusted under 35 U.S.C. 154(b) by 323 days.

(21) Appl. No.: 11/356,137

(22) Filed: Feb. 17, 2006

(65) Prior Publication Data

US 2006/0189094 A1 Aug. 24, 2006

(30) Foreign Application Priority Data

Feb. 18, 2005 (DE) .................. 10 2005 007 423

(51) Int. Cl.
*H01L 21/76* (2006.01)
*H01L 21/4763* (2006.01)

(52) U.S. Cl. .................. 438/430; 438/422; 438/424; 438/435; 438/627; 257/E21.499

(58) Field of Classification Search .................. 438/22, 438/422, 424, 430, 435; 257/E21.499
See application file for complete search history.

(56) References Cited

U.S. PATENT DOCUMENTS 4,797,715 A 1/1989 Thillays et al.
5,834,334 A * 11/1998 Leedy .................. 438/107
2003/0022397 A1* 1/2003 Hess et al. .................. 438/11
2005/0254673 A1* 11/2005 Hsieh et al. .................. 381/175

FOREIGN PATENT DOCUMENTS

| DE | 197 20 300 A1 | 12/1997 |
| EP | 0 478 426 A1 | 4/1992 |
| GB | 2 202 673 A | 9/1988 |
| GB | 2 224 600 A | 5/1990 |
| WO | WO-01/24259 A2 | 4/2001 |

* cited by examiner

*Primary Examiner*—Scott B. Geyer
*Assistant Examiner*—Seahvosh J Nikmanesh
(74) *Attorney, Agent, or Firm*—Muncy, Geissler, Olds, & Lowe, PLLC

(57) ABSTRACT

A method for integrating an electronic component or the like into a substrate includes following process steps: formation of a dielectric insulating layer on the front side of a substrate; complete back-etching of an area of the substrate from the back of the substrate to form a cavity; formation of a photoresistive layer with a homogeneous thickness over the back of the substrate; placement of an electronic component on the photoresistive layer formed in the cavity for adhesion of the electronic component to the photoresistive layer; removal of the formed photoresistive layer except for the area on which the electronic component adheres to the photoresistive layer in the cavity; and formation of a fixing layer over the back of the substrate to fix the electronic component in the cavity of the substrate.

19 Claims, 3 Drawing Sheets

METHOD FOR INTEGRATING AN ELECTRONIC COMPONENT OR SIMILAR INTO A SUBSTRATE

This nonprovisional application claims priority under 35 U.S.C. § 119(a) on German Patent Application No. DE 102005007423, which was filed in Germany on Feb. 18, 2005, and which is herein incorporated by reference.

BACKGROUND OF THE INVENTION

1. Field of the Invention

The present invention relates to a method for integrating an electronic component or the like into a substrate.

2. Description of the Background Art

The modeling of components integrated on a semiconductor substrate is becoming ever more important as operating frequencies increase, since reflections at discontinuities, overlapping, and power dissipation increase in this case. Consequently, in general it is essential to account for these effects in modeling, especially in the high-frequency range. The parasitic influence of substrate conductivity and additional capacitances cannot be ignored, particularly in the case of a low-resistance substrate such as a silicon substrate.

Although it is, in principle, applicable to any desired electronic components, the present invention and the problem on which it is based are by preference described in detail below with reference to a chip to be integrated into the substrate.

The integration of electronic components into a semiconductor substrate and the individual encapsulations have a significant effect on the performance, costs, reliability, and lifetime of the component. In general, unwired subsystems include various components, such as high-frequency transceivers, digital processors, MEMS, or the like. Microwave transceivers, for example, are comprised of both integrated circuits and passive components with filters and power devices, which are not integrated on the semiconductor substrate. These components are based on a variety of materials and technologies.

In the past, considerable improvements have been achieved in the manufacturing and characterization of electronic components, and a number of new components have been developed. The development of compound semiconductors, such as, e.g., gallium arsenide, indium phosphide, and the like, and the development of ternary semiconductors, made it possible to develop microwave and millimeter-wave components with excellent noise and performance characteristics. Microprocessing in the radio frequency range and MEMS have proven to be technologies capable of having a significant impact on existing architectures in the radio frequency range, for example in sensors such as radar sensors in particular, and also in the field of communications, by reducing weight, cost, size, and power dissipation. The technologies required to this end are now available.

Many high-power components have been produced in the past which are intended to be integrated in a semiconductor substrate and can be encapsulated with no loss in power. In this regard, a complete component can include multiple individual components, which are encapsulated one inside the next; an encapsulated system of this nature is called an SOP (System On a Package) system. A primary task in SOP systems is the integration of individual components or chips into a carrier substrate, in essence as a first level of encapsulation.

The conventional art encompasses several methods for integrating individual chips of different materials onto or into a substrate. The most common methods are known as bonding and flip-chip technologies.

Bonding is understood to mean the assembly of, for example, chips on a chip carrier, wherein an individual chip is glued onto a chip carrier by an epoxy adhesive, for example, in a chip bonder. Aluminum or gold wires are generally used for electrically connecting the contact areas of the chip (bond pads) to the associated contact traces of the substrate.

In wedge bonding, the bond wire is held horizontally above the bond area and is pinched off with a wedge-shaped tool, while the excess wire is pulled away.

In ball point bonding, a ball is formed at the end of the bond wire, for example with the aid of a hydrogen flame or an electric spark. The wires used have an approximate diameter of 10 to 25 µm. These very thin wires have a high inductance at higher frequencies. Moreover, changes in their wire lengths and their curved shapes cause disadvantageously varying performance as a function of the particular module.

In addition, flip-chip technology is known in the conventional art. In flip-chip technology, such as is shown in FIG. 2, a chip 8 is placed on a substrate 1 in a downward direction. Solder bumps 14 and adhesive joints, for example filled with conductive powder, serve as connecting means here, ensuring a good electrical connection. The thermal path runs directly through the substrate 1.

However, in this prior art approach it has proven disadvantageous that this thermal path is generally inadequate for reliable operation, for example, in the case of high power gallium arsenide MMICs, so that additional heat removal means must be provided. Another disadvantage of this approach is that the coefficients of thermal expansion of the individual materials used are different, which reduces the lifetime of the component.

Furthermore, efforts have been made to develop new methods for reliably integrating chips based on various materials onto or into a silicon substrate. Illustrated in FIG. 3 is a schematic cross-sectional view of an electronic component 8 integrated in a substrate 1. The substrate 1 is etched from a front side and the chip 8 is attached in the etched cavity by a thermally conductive adhesive.

In addition, an organic dielectric layer 16 is spin-coated onto the front side of the substrate 1 in order to make the surface of the entire wafer flat and smooth. As can also be seen in FIG. 3, suitable metallizations 18 for electrically contacting the chip 8 are provided on the organic dielectric layer 16.

However, it has proven to be a disadvantage in this conventional approach that precise control of the depth of the vertically etched cavity in the substrate 1 is difficult to achieve. Most standard semiconductor manufacturing processes require a maximum difference in height between the chip surface and the wafer surface of 2 µm. Despite the use of the spin-coated organic dielectric layer 16, it is possible to produce an electrical connection to the chip 8, but a planar structure is more desirable. Another disadvantage is that different chips with different overall heights require different cavity depths, so complex and costly etching methods must be used.

Moreover, the high thermal resistance of the structure shown in FIG. 3 presents a disadvantage. Although a thermally conductive adhesive or epoxy is normally used in these methods, these materials have a significantly lower thermal conductivity than silicon or metals such as gold or copper. When an air gap 17 occurs between the chip 8 and the substrate 1, as is shown in FIG. 3, the thermal resistance of the overall structure can even take on a still higher value.

Since thermally conductive adhesives and epoxies have high coefficients of thermal expansion, the structure shown in FIG. 3 has a large thermo-mechanical stress, which significantly and disadvantageously reduces the lifetime of the component as a whole.

Another conventional technology is known as "enhanced quasi-monolithic integration technology (QMIT)," which can be considered an organically deposited multi-chip module (MCM-D). This technology uses a common connection embodied as a thin film for the first level of encapsulation or packaging. Since this technology is still in its infancy, many efforts are currently underway to further improve this technology.

SUMMARY OF THE INVENTION

It is therefore an object of the present invention to provide a method for integrating an electronic component or the like into a substrate that eliminates the above-mentioned disadvantages and ensures simpler and more cost-effective integration of an electronic component into a substrate, and better heat removal, than common methods.

In the method according to an embodiment of the invention, for integrating an electronic component or the like into a substrate, the method includes the steps of: formation of a dielectric insulating layer on the front side of a substrate; complete back-etching of an area of the substrate from the back of the substrate to form a cavity; formation of a photoresistive layer in the cavity of the substrate; placement of the electronic component on the photoresistive layer formed in the cavity for adhesion of the electronic component to the photoresistive layer; removal of the formed photoresistive layer except for the area on which the electronic component adheres to the photoresistive layer in the cavity; and formation of a fixing layer over the back of the substrate to fix the electronic component in the cavity of the substrate.

The present invention thus has the advantage over the prior and conventional art that an electronic component or the like can be integrated into a conventional silicon substrate through a simple and economical method, wherein the electronic component is covered by the electrical insulating layers and is supported by the fixing layer.

Moreover, the method of the present invention creates an arrangement with a small size, low weight, and outstanding lifetime and reliability.

Furthermore, the possibility of integrating an MCM is provided, permitting the integration of active components that are based on different materials.

Moreover, as a result of the compact integration with simplified manufacturing steps, an economical method is ensured that is compatible with the current semiconductor technologies for producing analog or digital circuits, for example Si-MOS technology, SiGe HBT technology, and III-V compound semiconductor technology.

According to a further embodiment, the substrate can be designed as a silicon semiconductor substrate, gallium arsenide semiconductor substrate, or the like. Of course, any suitable semiconductor materials which can be anisotropically etched may be used.

According to another embodiment, the dielectric insulating layer produced on the front of the substrate can be made up of a first, a second, and a third dielectric insulating layer. Moreover, a fourth dielectric insulating layer can be formed on the back of the substrate. All dielectric insulating layers except the second dielectric insulating layer are preferably produced from an inorganic insulating material, for example a silicon oxide, particularly silicon dioxide, or from a silicon nitride or the like. These dielectric materials are especially suitable for anisotropic wet etching methods.

According to another example embodiment, the second dielectric insulating layer is produced from an organic insulating material such as, benzocyclobutene (BCB), a polyimide, SU-8, or the like. Advantageously, these organic insulating materials can, if necessary, easily be removed again.

The complete back-etching of an area of the substrate is preferably carried out by an anisotropic method, for example by an anisotropic wet etching method, through prior structuring of the fourth dielectric insulating layer.

According to another embodiment, the third and fourth dielectric insulating layers and the area of the first dielectric insulating layer located on the bottom of the cavity are removed by an appropriate process prior to the formation of the photoresistive layer. In this way, the substrate areas on which the photoresistive layer is to be applied are exposed. The photoresistive layer can be applied with a homogeneous thickness by a spin-coating method, a spray method, or the like, for example.

According to another example embodiment, the electronic component can be designed as a chip, transistor, circuit, MEMS or the like. It is obvious to one skilled in the art that any desired electronic components can advantageously be integrated into a semiconductor substrate.

The electronic component is preferably placed on the photoresistive layer in the cavity of the substrate by, for example, a fine placement machine. After the electronic component has been placed on the photoresistive layer, this layer is advantageously cured by a heat process. The removal of the photoresistive layer in the areas outside the electronic component is preferably carried out by a dry etching process.

According to another embodiment, the fixing layer for fixing the electronic component in the cavity of the substrate can be produced with a homogeneous thickness from a dielectric material, especially an amorphous silicon material, or from a metallic material, especially chromium or platinum. These materials are particularly suitable for gold or copper electroplating methods, with very good adhesion properties.

According to another preferred example embodiment, the second dielectric insulating layer and the remaining area of the photoresistive layer can be removed by a suitable method after the fixing layer is formed. Subsequently, a fifth dielectric insulating layer, especially one made from an organic insulating material such as benzocyclobutene (BCB), polyimide, SU-8 or the like, for example, is preferably formed on the front side of the substrate.

The fifth dielectric insulating layer is structured to connect the chip or the electronic component to another circuit or the like. With the aid of this structuring, any desired metallization can subsequently be formed.

According to another example embodiment, the free area of the cavity in the substrate can be filled by a filler material at the end of the integration process. For example, a polyimide filled with diamond powder can be used as the filler material. This material has especially advantageous thermal conductivities, i.e. a high coefficient of thermal conductivity, so that the heat from the arrangement is efficiently removed to the environment.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

In the figures, like reference numbers designate like or functionally equivalent components, unless otherwise specified.

It should be mentioned at this point that additional circuits or components on the substrate are not shown in the figures for reasons of clarity.

FIGS. 1a-1k illustrate cross-sectional views of individual process stages during a manufacturing process for integrating an electronic component 8 into a substrate 1 according to an example embodiment of the present invention.

Figure 1A:
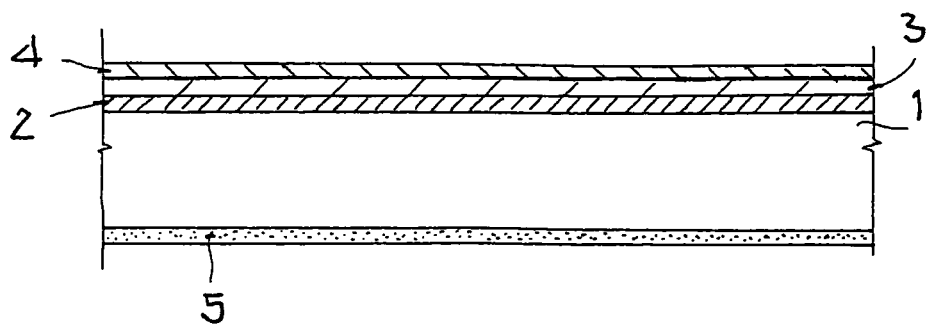
FIGS. 1a-i and 1k are cross-sectional views of different process stages of a method for integrating a chip into a substrate according to an embodiment of the present invention.
Figure 1B:
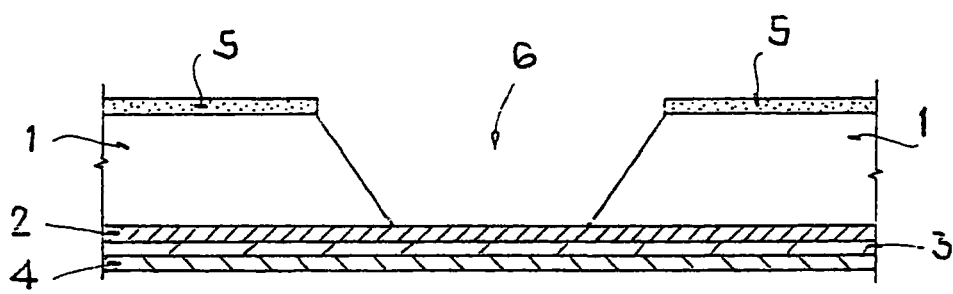
Figure 1C:
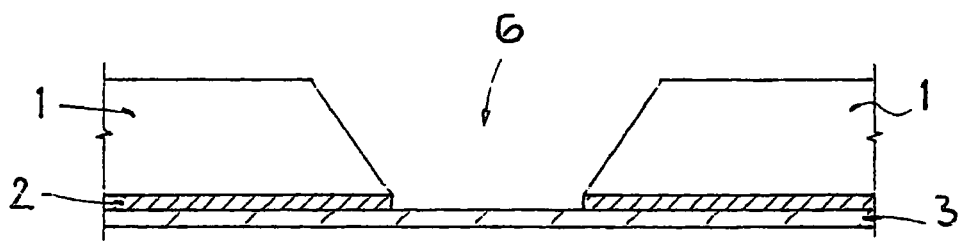
Figure 1D:
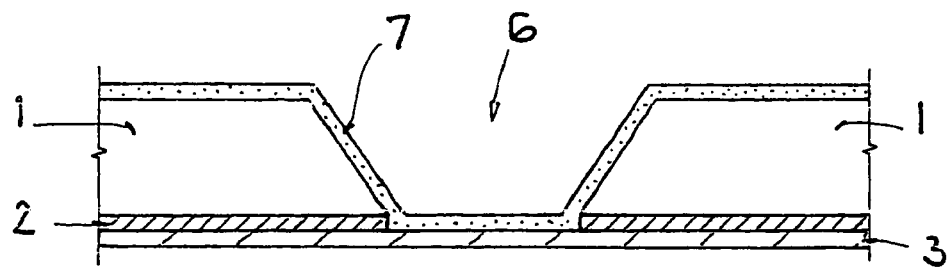
Figure 1E:
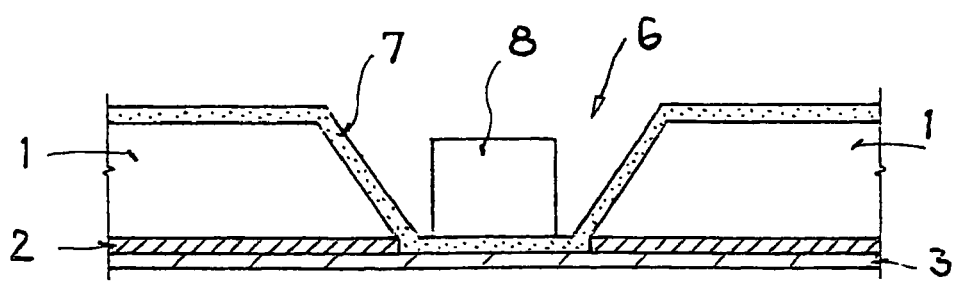
Figure 1F:
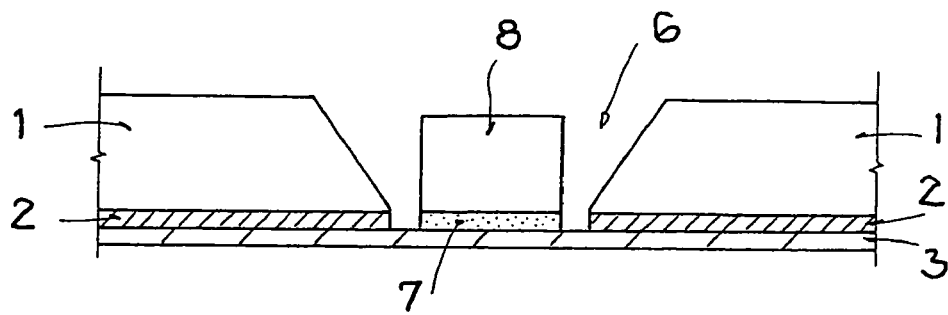
Figure 1G:
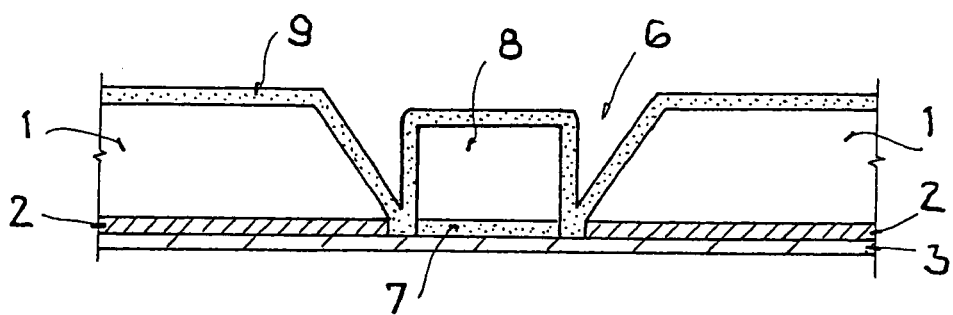
Figure 1H:
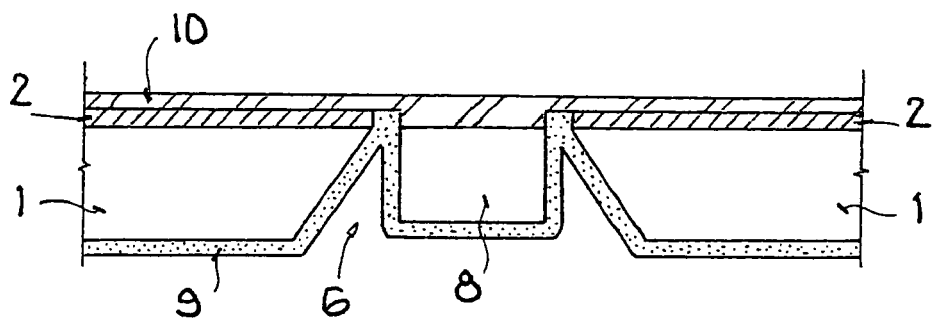
Figure 1I:
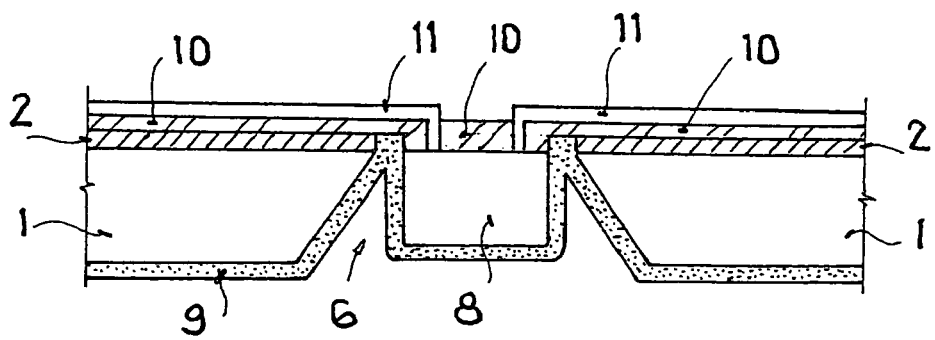
Figure 1K:
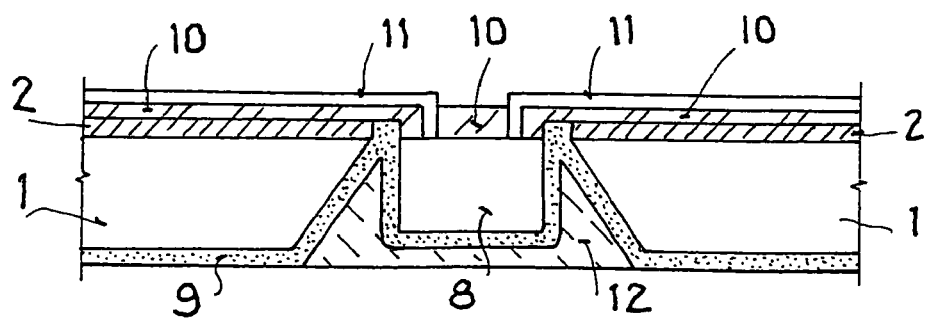
Figure 2:
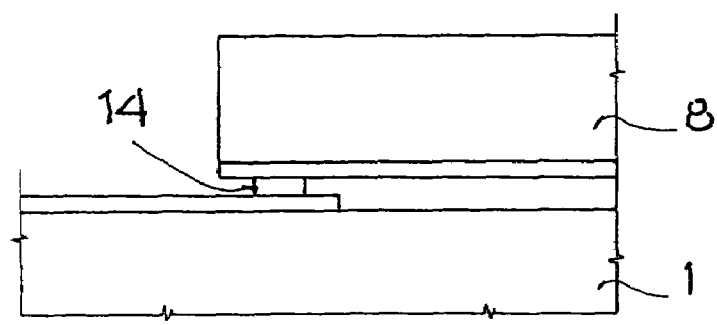
FIG. 2 is a schematic view of a flip-chip method according to the conventional art.
Figure 3:
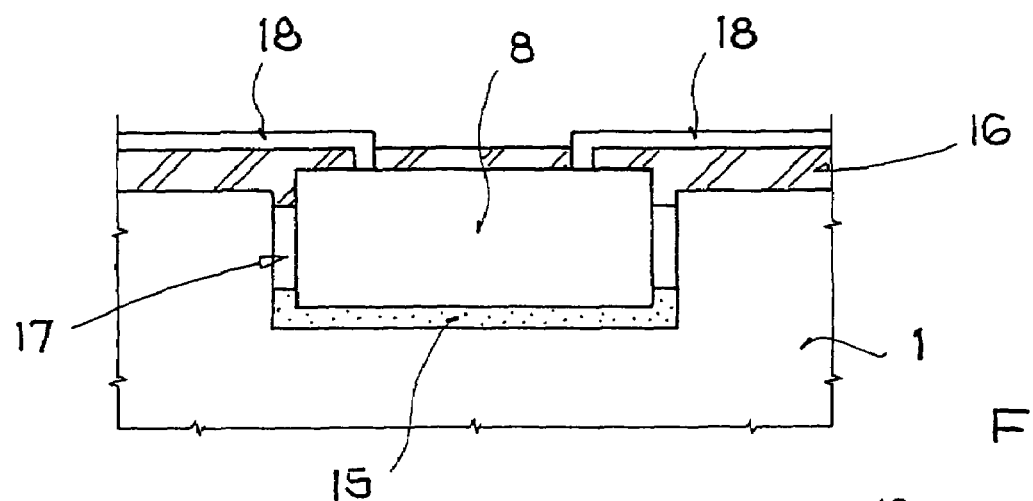
FIG. 3 is a cross-sectional view of a chip integrated in a substrate according to a conventional method.

It is noted that the orientation of the arrangement in FIGS. 1a, 1i and 1k is chosen such that the front side of the substrate 1 faces upward. In contrast, the representations in FIGS. 1b-1g are chosen such that the back of the substrate 1 faces upward. These views are chosen according to a favorable orientation of the substrate 1 with regard to the individual process steps, wherein a rotation of the substrate 1 for the individual process steps can be accomplished by a suitable substrate carrier mechanism.

For example, a low-resistance silicon semiconductor substrate, a gallium arsenide substrate, or any other semiconductor substrate that can be anisotropically etched, is used as the carrier substrate 1.

As can be seen in FIG. 1a, three dielectric insulating layers 2, 3, and 4 are initially formed on the front of the substrate 1. The first and third dielectric layers 2 and 4 can, for example, be embodied as silicon nitride or silicon dioxide layers. These materials are advantageous for masking in anisotropic wet etching of silicon.

The second dielectric layer 3 is preferably made of an organic dielectric as an auxiliary layer 3. The second dielectric insulating layer 3 is preferably made of such a material and produced on the first dielectric insulating layer 2 in such a manner as to be removable by a suitable process. Moreover, the second dielectric layer 3 serves as a carrier membrane for any electronic component that is to be installed, so its layer thickness for supporting the installed electronic component should be made thick enough to avoid breaks in the second dielectric insulating layer 3. The second dielectric layer 3 includes, for example, a polyimide, an organic polymer material, benzocyclobutene (BCB), an SU-8 material, or the like, and can be produced with a thickness of, for example, 10 μm to 20 μm to temporarily support a chip.

As is also illustrated in FIG. 1a, a fourth dielectric insulating layer 5 is applied to the back of the substrate 1. The fourth dielectric insulating layer, like the first and third dielectric insulating layers 2 and 4, is preferably made of an inorganic insulating material, for example a silicon dioxide, a silicon nitride, or the like.

Next, as shown in FIG. 1b, a cavity 6 is etched into the substrate 1 from the back of the substrate 1. The etching process can be accomplished in a conventional manner by a standard KOH wet etching process, for example. For the back-etching of the substrate 1, the fourth dielectric insulating layer 5 is structured beforehand on the back of the substrate 1 in a manner that is suitable and is known per se. The etching process is advantageously carried out in such a manner that the dielectric insulating layers 2, 3, and 4 on the front side of the substrate 1 remain undamaged by the aforementioned wet etching process. The cavity 6 in the substrate 1 shown in FIG. 1b thus results.

Thereafter, with reference to FIG. 1c, the fourth dielectric insulating layer 5 on the back of the substrate 1 and the third dielectric insulating layer 4, as well as the area of the first dielectric insulating layer 2 that is accessible from the opening of the cavity 6, are removed. This can be accomplished by an isotropic dry etching process, for example. This results in the structure shown in FIG. 1c, wherein the second dielectric insulating layer 3 covers the back-etched cavity 6 of the substrate 1 from the front of the substrate 1.

Next, as shown in FIG. 1d, a photoresistive layer 7 is deposited over the back of the substrate 1. For example, a positive photoresist 7 is applied over the back of the substrate 1 by a standard spin-coating or spraying process. It is obvious to one skilled in the art that a negative photoresist can be used with appropriately associated process steps instead of a positive photoresist.

The photoresistive layer 7 is preferably deposited over the back of the substrate 1 with a homogeneous layer thickness, as shown in FIG. 1d.

In a subsequent process step as shown in FIG. 1e, the electronic component to be integrated, in the present case a chip 8 for example, is placed in the cavity 6 from the back of the substrate 1 such that it rests against the photoresistive layer 7 on the bottom of the cavity 6 and adheres thereto.

The electronic component 8 can also be designed as a circuit component, a transistor, an MEM or the like instead of a chip. It is obvious to one skilled in the art that a component of any type, for example a passive or active component, can be integrated into a substrate using the concept of the present invention. Hereinafter, however, the example embodiment of the present invention will be further explained using a chip 8.

The chip 8 can be placed in precisely the desired location in the cavity 6, for example, with the aid of a fine placement machine or other appropriate tool. Such fine placement machines are adequately known to one skilled in the art and are not described in greater detail.

The photoresistive layer 7 is then baked, for example at a temperature of 60° C. to 90° C., for an extended period of time, for example in excess of 20 minutes. In this case, the photoresistive layer 7 is dried sufficiently for the subsequent steps and can later be removed again by simple means as described below.

Next, as shown in FIG. 1f, the photoresistive layer 7 is removed from the back of the substrate 1, for example by a dry etching process. Only in the area where the chip 8 sits on the photoresistive layer 7 and adheres to it is the photoresistive layer 7 not etched back. This results in the arrangement shown in FIG. 1f.

FIG. 1g illustrates the next process step carried out. Here, a fixing layer 9 is applied over the substrate 1 from the back of substrate 1. The fixing layer 9 serves to fix the component 8 in the cavity 6 of the substrate 1. The fixing layer 9 is preferably produced with a homogeneous thickness, as can be seen in FIG. 1g. The fixing layer 9 is preferably produced from a dielectric material, especially an amorphous silicon material, or from a metallic material. The thickness of the fixing layer 9 is preferably chosen so as to ensure secure and stable fixing of the chip 8 in the cavity 6. Moreover, the fixing layer 9 preferably has a high coefficient of thermal conductivity in order to be able to advantageously remove dissipated heat from the arrangement to the environment.

For the case of a metallic layer, thin layers, for example of chromium and/or platinum, each preferably with a thickness of less than 50 nm, are deposited on the back of the substrate 1 using an evaporation process, wherein the substrate 1 is preferably inclined in the direction of the metal flow and can be rotated into a suitable position by means of the aforementioned substrate carrier mechanism using an electric motor or the like.

Next, this thin layer of chromium and/or platinum can be thickened by an electroplating process depending on the thickness required to fix the component 8 in the cavity 6. A chromium layer has good adhesion characteristics with respect to the silicon substrate 1, and a platinum layer is an excellent metal for electroplating with copper or gold, with good adhesion characteristics. This type of production of the fixing layer 9 is especially suitable for high-power applications. Nonetheless, other methods for producing a suitable fixing layer are also possible.

Next, as is shown in FIG. 1h, after fixing of the chip 8 in the cavity 6, the second dielectric insulating layer 3 and the remaining part of the photoresistive layer 7 are removed from the front of the substrate 1 by a suitable process.

Next, as is likewise illustrated in FIG. 1h, a fifth dielectric insulating layer 10 is deposited over the front of the substrate 1 in order to ensure a flat surface over the entire substrate 1. The fifth dielectric insulating layer 10 is produced from an organic insulating material, for example, such as an organic polymer material, benzocyclobutene (BCB), a polyimide, or the like.

As shown in FIG. 1i, in order to electrically connect the chip 8 to associated circuits or the like, the fifth dielectric insulating layer 10 can be structured such that suitable metallizations 11 can be formed to ensure appropriate electrical contact with associated components. For microwave and millimeter-wave applications, an organic dielectric insulating layer 10 with a relatively great thickness is preferably used in order to reduce any substrate losses.

Finally, as shown in FIG. 1k, the free areas of the cavity 6 can be filled with a dielectric 12 having a high thermal conductivity. For example, a diamond-powder-filled polyimide, which has a high coefficient of thermal conductivity, can be used as the dielectric layer 12. It is obvious to one skilled in the art that the additional dielectric insulating layer 10 may be omitted under certain circumstances.

Although the present invention is described above using preferred example embodiments, it is not limited thereto, but rather can be modified in a variety of ways.

For example, with the arrangement described above, coplanar lines are implemented when a thick amorphous silicon layer is used as the dielectric fixing layer, and microstriplines are implemented when metallic layers are used as the fixing layer. However, this is only described by way of example so that it is obvious to one skilled in the art that any desired suitable materials and designs are possible for implementing the concept of the present invention.

For example, the overall dielectric layer inlcuding the first, second and third dielectric insulating layers, can be produced with a lesser or greater thickness depending on the component to be integrated into the substrate. Thicknesses and materials are preferably chosen so as to ensure a reliable and stable fixing of the component 8 in the cavity of the substrate.

Moreover, it is obvious to one skilled in the art that materials, layer thicknesses, and components other than those specified can be used without departing from the concept of the present invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for integrating an electronic component into a substrate, the method comprising the steps of:
   forming a dielectric insulating layer on a front side of a substrate;
   complete back-etching an area of the substrate from a back side of the substrate to form a cavity;
   forming a photoresistive layer at least in the cavity of the substrate;
   placing an electronic component on the photoresistive layer formed in the cavity for adhesion of the electronic component to the photoresistive layer;
   removing the formed photoresistive layer except for the area on which the electronic component adheres to the photoresistive layer in the cavity; and
   forming a fixing layer over the back side of the substrate to fixedly secure the electronic component in the cavity of the substrate.

2. The method according to claim 1, wherein the substrate is a silicon semiconductor substrate or a gallium arsenide semiconductor substrate.

3. The method according to claim 1, wherein the dielectric insulating layer formed on the front side of the substrate includes a first dielectric insulating layer, a second dielectric insulating layer, and a third dielectric insulating layer.

4. The method according to claim 3, wherein the second dielectric insulating layer and a region of the photoresistive layer that was not back-etched are removed by a process after formation of the fixing layer.

5. The method according to claim 4, wherein, after the removal of the second dielectric insulating layer and the region of the photoresistive layer that was not back-etched, a fifth dielectric insulating layer, made from an organic insulating material, benzocyclobutene (BCB), polyimide, or SU-8, is formed over the front side of the substrate.

6. The method according to claim 5, wherein the fifth dielectric insulating layer is structured and a metallization is formed corresponding to the formed structuring.

7. The method according to claim 3, wherein the first, and third dielectric insulating layers and a fourth dielectric insulating layer are produced from an inorganic insulating material, a silicon oxide, a silicon dioxide, or a silicon nitride.

8. The method according to claim 3, wherein the second dielectric insulating layer is an organic insulating material, benzocyclobutene (BCB), a polyimide, or SU-8.

9. The method according to claim 3, wherein the third dielectric insulating layer and a fourth dielectric insulating layer and the area of the first dielectric insulating layer located on the bottom of the cavity are removed by a process prior to the formation of the photoresistive layer.

10. The method according to claim 1, wherein a fourth dielectric insulating layer is formed on the back side of the substrate.

11. The method according to claim 10, wherein the complete back-etching of an area of the substrate is performed by an anisotropic etching method or an anisotropic wet etching method, through structuring of the fourth dielectric insulating layer.

12. The method according to claim 1, wherein the photoresistive layer is formed to have a homogeneous thickness by a spin-coating method or a spray method.

13. The method according to claim 1, wherein the electronic component is a chip, transistor, circuit, or MEMS.

14. The method according to claim 1, wherein the electronic component is placed on the photoresistive layer in the cavity of the substrate by a fine placement machine.

15. The method according to claim 1, wherein the photoresistive layer is treated by a heat process after the electronic component has been placed.

16. The method according to claim 1, wherein the removal of the photoresistive layer is performed by a dry etching process.

17. The method according to claim 1, wherein the fixing layer is produced with a homogeneous thickness from a dielectric material, an amorphous silicon material, a metallic material, chromium or platinum.

18. The method according to claim 1, wherein a free area of the cavity in the substrate is filled at an end of the integration process by a filler material with a high coefficient of thermal conductivity or a polyimide filled with diamond powder.

19. The method according to claim 1, wherein a surface of the electronic component is coplanar with the front side of the substrate.

* * * * *